(12) United States Patent
Wakabayashi et al.

(10) Patent No.: US 6,483,151 B2
(45) Date of Patent: Nov. 19, 2002

(54) SEMICONDUCTOR DEVICE AND METHOD OF MANUFACTURING THE SAME

(75) Inventors: Hitoshi Wakabayashi, Tokyo (JP); Yukishige Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/754,637

(22) Filed: Jan. 4, 2001

(65) Prior Publication Data

US 2001/0015463 A1 Aug. 23, 2001

(30) Foreign Application Priority Data

Jan. 21, 2000 (JP) ........................................ 2000-013428

(51) Int. Cl.[7] .............................................. H01L 29/76
(52) U.S. Cl. ...................... 257/369; 257/407; 257/412; 257/915
(58) Field of Search ................................. 257/369, 371, 257/392, 407, 410, 412, 915

(56) References Cited

U.S. PATENT DOCUMENTS 6,255,698 B1 * 7/2001 Gardner et al. .............. 257/412

FOREIGN PATENT DOCUMENTS

| JP | 06-005852 | 1/1994 |
|----|-----------|--------|
| JP | 09-148455 | 6/1997 |
| JP | 11-224947 | 8/1999 |
| JP | 11-307729 | 11/1999 |

* cited by examiner

Primary Examiner—Mark V. Prenty
(74) Attorney, Agent, or Firm—Kattan, Muchin, Zavis Rosenman

(57) ABSTRACT

One object of the present invention is to suppress a threshold voltage of at least an n-channel MISFET using a nitride of a high melting point metal at it's gate electrode. In order to achieve the object, a gate electrode 109 of a p-channel MISFET is constituted of a titanium nitride film 106 and a tungsten film 107 formed on the film 106 and a gate electrode 110*a* of an n-channel MISFET is constituted of a titanium nitride film 106*a* and a tungsten film 107 formed on the film 106*a*. The titanium nitride film 106*a* is formed by nitrogen ion implantation in the titanium nitride film 106 to decrease the work function.

24 Claims, 9 Drawing Sheets

SEMICONDUCTOR DEVICE AND METHOD OF MANUFACTURING THE SAME

BACKGROUND OF THE INVENTION

1. Field of the Invention

The present invention relates to a semiconductor device comprising an n-channel type insulated gate field effect transistor (herein after abbreviated as "MISFET") and p-channel type MISFET with short gate lengths and relates to a method manufacturing the semiconductor device.

2. Description of the Related Art

MISFET has highly been integrated and improved to have high speed by making the configuration fine based on the scaling law.

In terms of example, it is required to make a gate insulating film as thin as 2 nm or thinner in a MISFET with 0.1 μm or shorter gate length. In the case a polycrystalline silicon film used as a constituent material for a gate electrode, a capacity is formed in the gate electrode in such a fine structure by depletion of impurities. Further, carrier quantization occurring in a channel inversion layer forms a capacity. Such capacities are formed in series in relation to the gate insulating film MOS capacity and therefore, the gate capacity is considerably lowered. It is possible to suppress the capacity attributed to the depletion among those capacities by using a metal for a constituent material of the gate electrode. In that case, in order to suppress the reaction of the gate metal film and the gate insulating film at the time of thermal treatment, it is necessary to form a barrier film with high conductivity between the gate metal film and the gate insulating film. A high melting point metal nitride such as titanium nitride, tungsten nitride or tantalum nitride may generally be used for the barrier film.

Further, the cross-section of the gate electrode and a diffusion layer is narrowed following the scaling to result in high sheet resistance of them and difficulty of fabrication of semiconductor device with high speed and excellent capability. In so far as the gate length is 0.12 μm, the countermeasure to deal with this problem is to employ salicide technique, that is, self-alignment silicide technique which involves process of forming a high melting point metal film e.g. a titanium film or a cobalt film on a polycrystalline silicon film and/or on a diffusion layer and making the metal film a silicide to form a high melting point metal silicide film and a high melting point metal silicide layer on the surface of them.

However, in the generation in which the gate length is narrowed to 0.1 μm or shorter, it has become hard to lower the resistance by the foregoing technique, because in an ultra-fine wire layer, the reaction of conversion into silicide is unreliable.

It becomes, therefore, effective to employ a metal film with a lower resistivity than that of a high melting point metal silicide film in order to lower the resistance of the gate electrode. Especially, in order to avoid increase of resistivity by post heating treatment, a high melting point metal film is required to be used as the metal film. The high melting point metal to be used is generally titanium, tungsten or tantalum. In order to suppress the reaction of the high melting point metal film of the gate electrode and the gate insulating film by the foregoing heating treatment, it is required to form a barrier film with a high conductivity between the high melting point metal film of the gate electrode and the gate insulating film.

The configuration of a complementary type MISFET comprising a high melting point metal film of the gate electrode and its fabrication method will be described in reference to FIG. 1A to FIG. 1C, which are cross-sectional views of manufacturing process steps of the semiconductor device.

First of all, an element separation region 402 is formed on the surface of a silicon substrate 401 and an n-type well region 403 and a p-type well region 404 are formed. A gate oxide film 405 is formed by thermal oxidation on the n-type well region 403 and the p-type well region 404. A titanium nitride film 406, a tungsten film 407, and a hard mask film 408 of a first insulating film are successively formed on the whole surface (FIG. 1A).

Then, the above described hard mask film 408, tungsten film 407, and titanium nitride film 406 are successively patterned by anisotropic etching to form a first gate electrode 409 with a layered structure of the titanium nitride film 406 and the tungsten film 407 on the surface of the n-type well 403 and to form a second gate electrode 410 with a layered structure of the titanium nitride film 406 and the tungsten film 407 on the surface of the p-type well 404. Following that, an n-type source/drain extension region 411 and a p-type pocket region 412 are formed on the surface of the p-type well region 404 by ion implantation of n-type impurities and ion implantation of p-type impurities using the gate electrode 410 as a mask. In the same manner, a p-type source/drain extension region 413 and an n-type pocket region 414 are formed on the surface of the n-type well region 403 by ion implantation of p-type impurities and ion implantation of n-type impurities using the gate electrode 409 as a mask (FIG. 1B).

Next, a second insulating film formed on the whole surface is etched back to form side wall spacers 415 covering the side faces of the gate electrodes 409, 410. Following that, an n$^+$-source/drain region 416 is formed on the surface of the p-type well 404 by ion implantation of n-type impurities using the side wall spacers 415 and the gate electrode 410 as a mask. In the same manner, a p$^+$-source/drain region 417 is formed on the surface of the n-type well 403 by ion implantation of p-type impurities using the side wall spacers 415 and the gate electrode 409 as a mask. Successively, for example, a titanium film is formed on the whole surface and made to be silicide to form a titanium silicide layer 418 respectively on the n$^+$-source/drain region 416 and p$^+$-source/drain region 417 (FIG. 1C). After that, though being not illustrated, an interlayer insulating film or the like is formed on the whole surface to complete a conventional semiconductor device comprising a complementary type MISFET.

However, the absolute values of threshold voltage values of the foregoing n-channel type MISFET comprising the gate electrode 410 and the foregoing p-channel type MISFET comprising the gate electrode 409 are unfavorably increased as compared with those of an n-channel type MISFET comprising a gate electrode made of an n$^+$-type polycrystalline silicon film and a p-channel type MISFET comprising a gate electrode made of a p$^+$-type polycrystalline silicon film. That is attributed to that the Fermi level of a high melting point metal nitride generally exists between the lower end of the conduction band and the upper end of the filled band of silicon. The increase of the absolute value of the threshold voltage results in decrease of the operation speed of a complementary MISFET.

In general, the threshold voltage in a MISFET comprising a gate electrode made of polycrystalline silicon film is controlled by doping a surface part of a silicon substrate to be a channel region with an impurity to be a donor or an acceptor. However, such control of the threshold voltage by doping with an impurity is impossible for a MISFET having a gate electrode with a layered structure comprising a high melting point metal nitride film and a high melting point metal film.

SUMMARY OF THE INVENTION

Accordingly, one object of the present invention is to provide semiconductor devices each having a gate electrode structure capable of suppressing increase of the absolute value of the threshold voltage of at least either an n-channel or a p-channel in a complementary type MISFET.

Another object of the present invention is to provide methods of manufacturing the semiconductor device having such a gate electrode structure.

According to one feature of the present invention, there is provided a semiconductor device which comprises a silicon substrate, an n-type well and a p-type well separated from each other by an element separation region and formed on the surface of the substrate. A p-channel type MISFET having a first gate electrode and formed on the n-type well, an n-channel type MISFET having a second gate electrode and formed on the p-type well. The first gate electrode is formed on the surface of the n-type well by interposing a first gate oxide film. The first gate electrode includes a first conductive film of a nitride of a first high melting point metal directly coating the surface of the first gate oxide film and a second high melting point metal film formed on the surface of the first conductive film. The second gate electrode formed on the surface of the p-well by interposing a second gate oxide film. The second gate electrode includes a second conductive film of a nitride of the first high melting point metal with higher nitrogen content than that of the first conductive film and directly coating the surface of the second gate oxide film and a metal film formed on the surface of the second conductive film. Preferably, the side faces of the above described first and second gate electrodes are directly covered with side wall spacers, respectively. The first and second gate oxide films are thermal oxidation films and the metal film constituting the second gate electrode is the above described second high melting point metal film and the above described first high melting point metal is one of titanium, tungsten and tantalum. Further, preferably, the side faces of the first gate electrode are directly covered with side wall spacers and the side faces of the second gate electrode are covered with the side wall spacers through the second gate oxide film and the above described first high melting point metal is one of titanium, tungsten and tantalum.

Furthermore, the crystal orientation of said second conductive film might differ from that of the first conductive film.

Further feature of the present invention, there is provided a semiconductor device which comprises a silicon substrate, an n-type well and a p-type well separated from each other by an element separation region and formed on the surface of the substrate, a p-channel type MISFET having a first gate electrode and formed on the n-type well, an n-channel type MISFET having a second gate electrode and formed on the p-type well, and side wall spacers of respectively insulating films coating the side faces of the first and second gate electrodes. The first gate electrode is formed on the surface of the n-type well through a first gate oxide film formed by thermal oxidation, and includes a first conductive film of a nitride of a first high melting point metal directly coating the surface of the first gate oxide film and a second high melting point metal film formed on the surface of the first conductive film. The second gate electrode is formed on the surface of the n-well through a second gate insulating film containing nitrogen, and includes nitride of the first high melting point metal with higher nitrogen content than that of the first conductive film and directly coating the surface of the second gate insulating film and a metal film formed on the surface of the second conductive film. Side faces of the first gate electrode are directly coated with the side wall spacers and the side faces of the second gate electrode are coated with the side wall spacers through the gate insulating film. Preferably the gate insulating film is either a silicon nitride film or a silicon nitride oxide film. The first high melting point metal may be one selected from titanium, tungsten and tantalum.

Yet further feature of the present invention, there is provided a semiconductor device which comprises a silicon substrate, an n-type well and a p-type well separated from each other by an element separation region and formed on the surface of the substrate, a p-channel type MISFET having a first gate electrode and formed on the n-type well, an n-channel type MISFET having a second gate electrode and formed on the p-type well, and side wall spacers of respectively insulating films coating the side faces of the first and second gate electrodes. The first gate electrode is formed on the surface of the n-type well through a gate oxide film formed by thermal oxidation, and includes a first conductive film of a nitride of a first high melting point metal directly coating the surface of the gate oxide film and a second high melting point metal film formed on the surface of the gate oxide film. The second gate electrode is formed on the surface of the n-well through a gate insulating film, and includes a second conductive film of a nitride of a third high melting point metal different from the first high melting point metal and directly coating the surface of the gate insulating film and a metal film formed on the surface of the second conductive film. Side faces of the first gate electrode are directly coated with the side spacers and the side faces of the second gate electrode are coated with the side spacers through the gate insulating film. Preferably the first high melting point metal is titanium and the third high melting point metal is tantalum.

According to one feature of another aspect of the present invention, there is provided a method of manufacturing a semiconductor device comprises the steps of: forming an n-type well and a p-type well separated from each other by an element separation region on the surface of a silicon substrate and forming a gate oxide film on the surface of the n-type well and p-type well by thermal oxidation; forming a conductive film of a nitride of a first high melting point metal on the whole surface, forming a mask film pattern covering the surface of the n-type well and ion-implanting nitrogen in the conductive film using the mask film pattern as a mask; and successively forming a second high melting point metal film and hard mask film of a first insulating film on the whole surface and successively patterning the hard mask film, the second high melting point metal film and the conductive film by anisotropic etching to form a first and a second gate electrodes on the surface of the n-type well and the p-type well, respectively. Preferably the first high melting point metal is one selected from titanium, tungsten and tantalum.

Further feature of another aspect of the present invention, there is provided a method of manufacturing a semiconductor device comprises the steps of: forming an n-type well and a p-type well separated from each other by an element separation region on the surface of a silicon substrate and forming a first gate oxide film on the surface of said n-type well and p-type well by thermal oxidation; forming a first conductive film of a nitride of a first high melting point metal on the whole surface by reactive sputtering in a first nitrogen gas flow rate and further successively forming a second high melting point metal film and hard mask film of a first insulating film; successively patterning the hard mask film, the second high melting point metal film and the conductive film by anisotropic etching to form a first gate electrode on the surface of the n-type well and at the same time to form a temporary gate electrode on the p-type well; forming a second insulating film on the whole surface, forming side wall spacers respectively coating the side faces of the first gate electrode and the temporary gate electrode by etching back the second insulating film; forming a $p^+$-type source/drain region on the surface of the n-type well by ion implantation of p-type impurities using the first gate electrode and side wall spacers as a mask, forming an $n^+$-type source/drain region on the surface of the p-type well by ion implantation of n-type impurities the temporary gate electrode and side wall spacers as a mask, forming a third high melting point metal film on the whole surface and forming a high melting point metal silicide layer in a self-alignment manner on the surface of the $p^+$-type source/drain region and the $n^+$-type source/drain region; forming an interlayer insulating film on the whole surface and carrying out chemical-mechanical polishing (CMP) of the interlayer insulating film until the upper face of the hard mask film is exposed; forming a mask film pattern covering the surface of the n-type well and successively removing the hard mask film, the temporary gate electrode and the first gate oxide film by etching using said mask film pattern as a mask; forming a second gate oxide film on the whole surface by a chemical vapor deposition method; forming a second conductive film of a nitride film of a first high melting point metal by reactive sputtering in a second nitrogen gas flow rate higher than the first nitrogen gas flow rate, and successively forming a metal film on the whole surface; and carrying out CMP of the metal film, the second conductive film and the second gate oxide film until the upper face of the interlayer insulating film is exposed. Preferably the first high melting point metal is one selected from titanium, tungsten, and tantalum. Further preferably, the foregoing second nitrogen gas flow rate is so set as to make the crystal orientation of the second conductive film different from the crystal orientation of the first conductive film. Furthermore, the first high melting point metal is one selected from titanium, tungsten and tantalum.

Yet further feature of another aspect of the present invention, there is provided a method of manufacturing a semiconductor device comprises the steps of: forming an n-type well and a p-type well separated from each other by an element separation region on the surface of a silicon substrate and forming a gate oxide film on the surface of said n-type well and p-type well by thermal oxidation; forming a first conductive film of a nitride of a first high melting point metal on the whole surface and further successively forming a second high melting point metal film and hard mask film of a first insulating film; successively patterning the hard mask film, the second high melting point metal film and the conductive film by anisotropic etching to form a first gate electrode on the surface of the n-type well and at the same time to form a temporary gate electrode on the p-type well; forming a second insulating film on the whole surface, forming side wall spacers respectively coating the side faces of said first and temporary gate electrodes by etching back the second insulating film, forming a $p^+$-type source/drain region on the surface of the n-type well by ion implantation of p-type impurities using the first gate electrode and side wall spacers as a mask, forming an $n^+$-type source/drain region on the surface of the p-type well by ion implantation of n-type impurities using the temporary gate electrode and side wall spacers as a mask, forming a third high melting point metal film on the whole surface and forming a high melting point metal silicide layer in a self-alignment manner on the surface of the $p^+$-type source/drain region and $n^+$-type source/drain region; forming an interlayer insulating film on the whole surface and carrying out CMP of the interlayer insulating film until the upper face of the hard mask film is exposed; forming a mask film pattern covering the surface of the n-type well and successively removing the hard mask film, the temporary gate electrode and the first gate oxide film by etching using the mask film pattern as a mask; forming a gate insulating film containing nitrogen on the whole surface by a chemical vapor deposition method; successively forming a second conductive film of a nitride film of a first high melting point metal and a metal film on the whole surface; diffusing nitrogen in the second conductive film from the gate insulating film by heating; and carrying out CMP of the metal film, the second conductive film and the second gate oxide film until the upper face of the interlayer insulating film is exposed and forming a second gate electrode on the surface of the p-type well. Preferably the first high melting point metal is one selected from titanium, tungsten, and tantalum.

More further feature of another aspect of the present invention, there is provided a method of manufacturing a semiconductor device comprises the steps of: forming an n-type well and a p-type well separated from each other by an element separation region on the surface of a silicon substrate and forming a gate oxide film on the surface of the n-type well and p-type well by thermal oxidation; forming a first conductive film of a nitride of a first high melting point metal on the whole surface and further successively forming a second high melting point metal film and hard mask film of a first insulating film; successively patterning the hard mask film, the second high melting point metal film and the conductive film by anisotropic etching to form a first gate electrode on the surface of said n-type well and at the same time to form a temporary gate electrode structure on the p-type well; forming a second insulating film on the whole surface, forming side wall spacers respectively coating the side faces of the first electrode and temporary gate electrode by etching back the second insulating film, forming a $p^+$-type source/drain region on the surface of said n-type well by ion implantation of p-type impurities using the first gate electrode and side wall spacers as a mask, forming an $n^+$-type source/drain region on the surface of the p-type well by ion implantation of n-type impurities using the temporary gate electrode and sidewall spacers as a mask, forming a third high melting point metal film on the whole surface and forming a high melting point metal silicide layer in a self-alignment manner on the surface of the $p^+$-type source/drain region and $n^+$-type source/drain region; forming an interlayer insulating film on the whole surface and carrying out CMP of the interlayer insulating film until the upper face of said hard mask film is exposed; forming a mask film pattern covering the surface of said n-type well and successively removing the hard mask film, the temporary gate electrode and the gate oxide film by etching using the mask film pattern as a mask; forming a gate insulating film on the whole surface by a chemical vapor deposition method;

forming a second conductive film of a nitride film of a fourth high melting point metal and further a metal film on the whole surface; and forming a second gate electrode on the surface of the p-type well by carrying out CMP of the metal film, the second conductive film and the second gate oxide film until the upper face of the interlayer insulating film is exposed. Preferably, the first high melting point metal is titanium and the fourth high melting point metal is tantalum.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

The present invention will be described in detail in reference with figures.

A semiconductor device of the first embodiment of the present invention comprises a p-channel type MISFET having a first gate electrode and an n-channel type MISFET having a second gate electrode. The first gate electrode is formed on the surface of an n-type well by interposing a first gate oxide film and the second gate electrode is formed on the surface of a p-type well by interposing a second gate oxide film. The side faces of the first and the second gate electrodes are coated with side wall spacers made of an insulating film, respectively. The side faces of at least the first gate electrodes are directly coated with the side wall spacers.

The first gate electrode has a layered structure constituted of a first conductive film of a nitride of a first high melting point metal and a second high melting point metal film. The first conductive film directly covers the surface of the first gate oxide film. The second gate electrode has a layered structure constituted of a second conductive film of a nitride of the first high melting point metal and a metal film. The second conductive film also directly covers the surface of the second gate oxide film. The characteristic of the present first embodiment is that the nitrogen content in the second conductive film is controlled to be higher than that in the first conductive film.

Figure 1A:
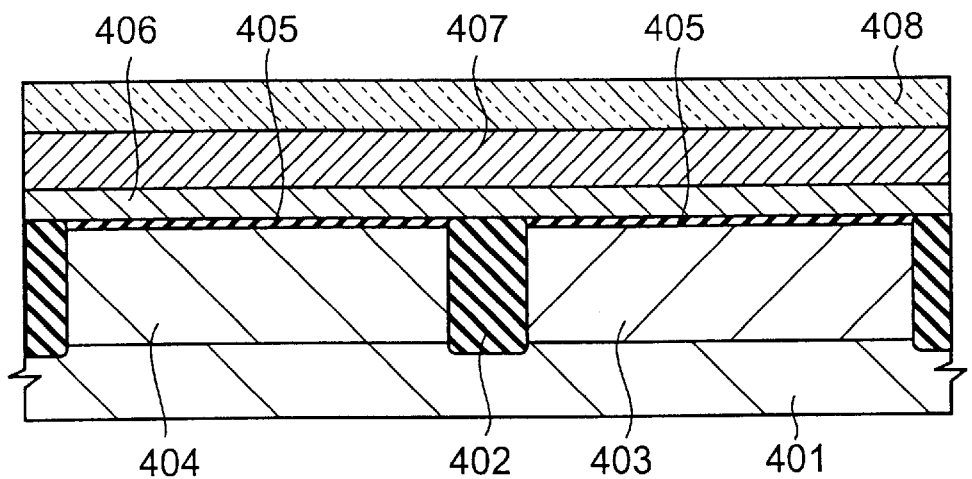
FIG. 1A to FIG. 1C are cross-sectional views showing process steps of a conventional semiconductor device.
Figure 1B:
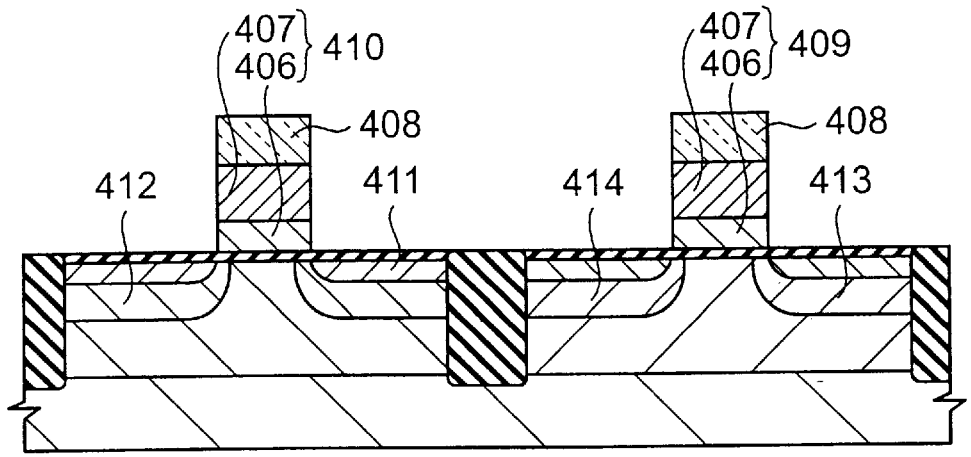
Figure 1C:
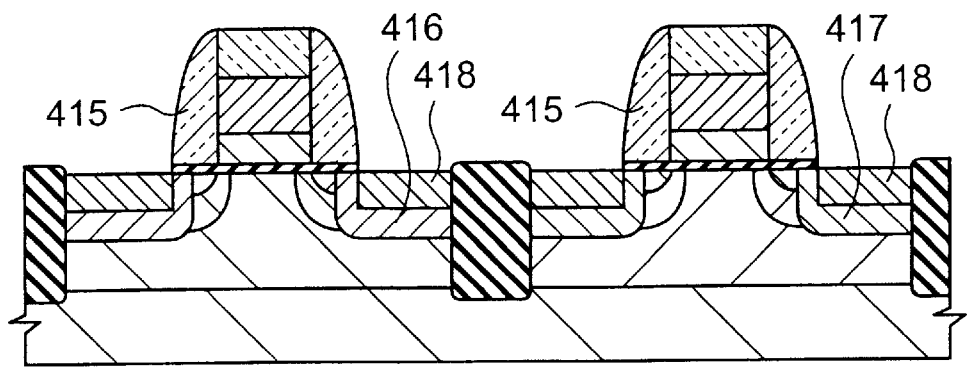
Figure 2:
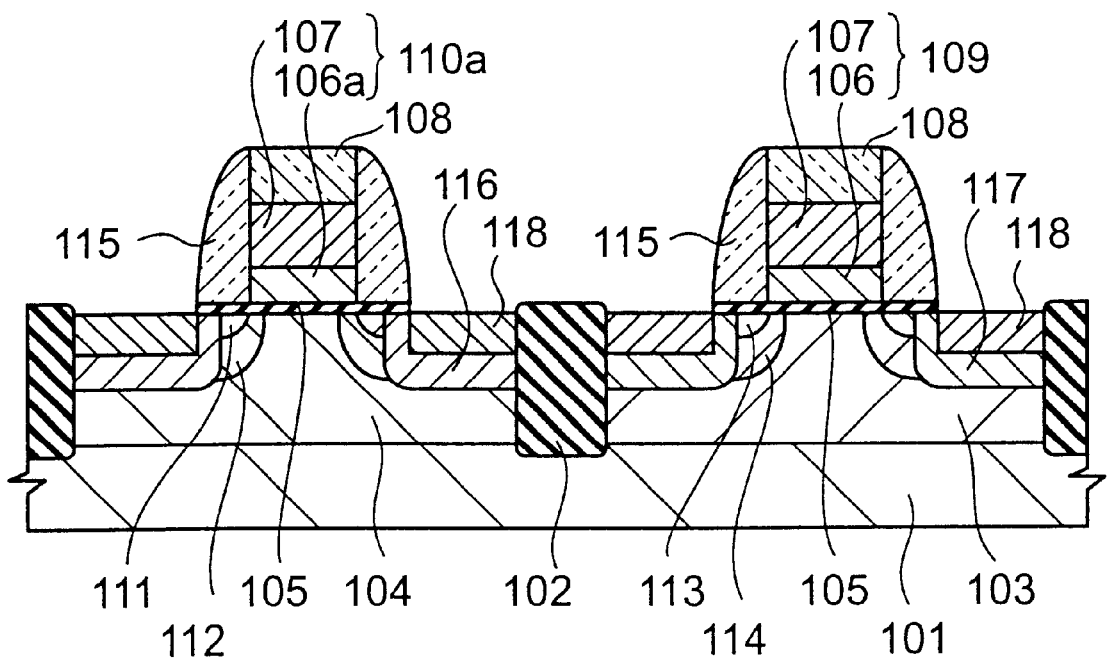
FIG. 2 is a cross-sectional views showing a first embodiment of the present invention.

FIG. 2 is a schematic diagram of a cross-section of a semiconductor device according to a first embodiment of the present invention. The constitution of a semiconductor device of the first embodiment is as follows.

An n-type well 103 and a p-type well 104 separated from each other by an element separation region 102 (e.g. a STI structure in which a shallow groove is filled with an insulating film) are formed on the surface of a silicon substrate 101. A gate oxide film 105 is formed on the surface of the n-type well 103 and the p-type well 104 by thermal oxidation. In other words, the first gate electrode and the second gate electrode are same shape in this first embodiment. A p-channel type MISFET having a first gate electrode 109 is formed on the surface of the n-type well 103 and an n-channel type MISFET having a second gate electrode 110a is formed on the surface of the p-type well 104. The upper faces of the gate electrodes 109, 110a are respectively directly coated with a hard mask film 108 of a first insulating film (e.g. silicon nitride film) and the side faces of the gate electrodes 109, 110a are respectively coated with side wall spacers 115 of a second insulating film (e.g. a silicon oxide film).

The first gate electrode 109 formed on the surface of the n-type well 103 through the gate oxide film 105 is a layered film constituted of, for example, a titanium nitride film 106 (a first conductive film of a nitride of a first high melting point metal) directly coating the surface of the gate oxide film 105 and, for example, a titanium nitride film 106 and a tungsten film 107 (a second high melting point metal film) formed on the titanium nitride film 106. The second gate electrode 110a formed on the surface of the p-type well 104 through the gate oxide film 105 is a layered film constituted of, for example, a titanium nitride film 106a (a second conductive film of a nitride of a first high melting point metal) directly coating the surface of the gate oxide film 105 and, for example, a tungsten film 107 (a second high melting point metal film) formed on the titanium nitride film 106a.

In the first embodiment, the titanium nitride film 106a, which is a second conductive film (details will be described later), is a converted film of the titanium nitride film 106, which is the first conductive film and the nitrogen content of the titanium nitride film 106a is higher than that of the titanium nitride film 106. Also in the first embodiment, a metal film 107, the constituent part material of the gate electrode 110a, which is the second gate electrode, is a tungsten film 107, the constituent part material of the gate electrode 109, which is the first gate electrode.

An n-type source/drain extension region 111 and a p-type pocket region 112 are formed on the surface of the p-type well 104 in a self-alignment manner with the gate electrode 110a and an n⁺-type source/drain region 116 is formed in a self-alignment manner with the gate electrode 110a and the side wall spacers 115. A p-type source/drain extension region 113 and an n-type pocket region 114 are formed on the surface of the n-type well 103 in a self-alignment manner with the gate electrode 109 and a p⁺-type source/drain region 117 is formed in a self-alignment manner with the gate electrode 109 and the side wall spacers 115. The surface of the n⁺-type source/drain region 116 and the p⁺-type source/drain region 117 is covered with a high melting point metal silicide 118 (of a silicide of a third high melting point metal) in respectively self-alignment manner (in a salicide structure in terms of narrow definition). The high melting point metal silicide layer 118 is titanium silicide or cobalt silicide.

A semiconductor device of the first embodiment will be fabricated as following in reference with FIG. 3A to FIG. 3D and FIG. 2, which are cross-section schematic diagrams of the semiconductor device fabrication processes.

Figure 3:
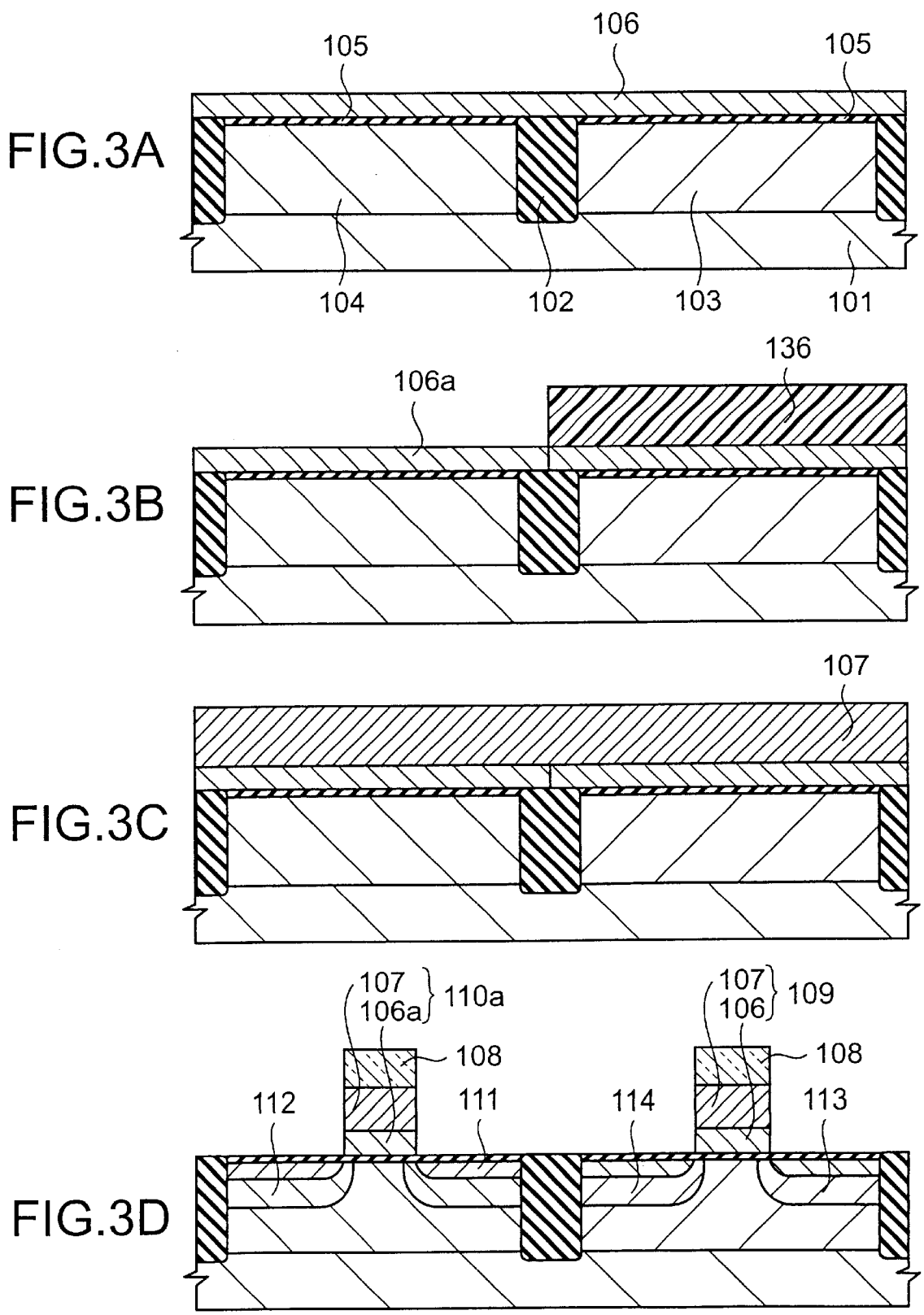
FIG. 3A to FIG. 3D are cross-sectional views showing process steps of the first embodiment.

At first, an element separation region 102 with, for example, an STI structure, an n-type well 103 and a p-type well 104 are formed on the surface of a silicon substrate 101. The depth of the element separation region 102 is at deepest about 1000 nm. A gate oxide film 105 is formed by thermal oxidation respectively on the surface of the n-type well 103 and the p-type well 104. The film thickness of the gate oxide film 105 is, for example, 3.5 nm and at thickest about 10 nm. Following that, a titanium nitride film 106 as a first conductive film of a nitride of a first high melting point metal is formed on the whole surface by reactive sputtering (alternatively by CVD) The film thickness of the titanium nitride film 106 is at thickest about 100 nm (FIG. 3A).

In this first embodiment, the first high melting point metal is not necessarily limited to be titanium but may be other high melting point metals such as tungsten, tantalum, or the like.

Next, a mask film such as photoresist film pattern 136 is formed to cover the surface of the n-type well 103. Using the photoresist film pattern 136 as a mask, ion implantation of nitrogen in $1 \times 10^{14}/cm^2$ or more dose is carried out at 100 keV or lower energy to convert the titanium nitride film 106 on the surface of the p-type well 104 to the titanium nitride film 106a (FIG. 3B).

Next, the foregoing photoresist film pattern 136 is peeled off using an organic solvent. After that, for example, a tungsten film 107 as a second high melting point metal film is formed on the whole surface by sputtering or CVD. The film thickness of the tungsten film 107 is at thickest about 200 nm (FIG. 3C).

Next, a hard mask film 108, which is a first insulating film of, for example, a silicon nitride film is formed on the whole surface by CVD. The film thickness of the hard mask film 108 is at thinnest about 10 nm. In this first embodiment, the second high melting point metal film is not necessarily limited to be a tungsten film.

Next, the hard mask film 108, the tungsten film 107, the titanium nitride film 106 and the titanium nitride film 106a are successively patterned by anisotropic etching to form a gate electrode 109 (with a layered structure of the titanium nitride film 106 and the tungsten film 107) and a gate electrode 110a (with a layered structure of the titanium nitride film 106a and the tungsten film 107) on the upper faces of which the hard mask film 108 is respectively formed. Patterning of the tungsten film 107 is carried out using a gas mixture of $SF_6$ and HBr and patterning of the titanium nitride films 106, 106a is carried out using a gas mixture of Ar and HBr. Additionally, in this first embodiment, the hard mask film 108 is not required and the etching mask for the foregoing patterning may be of only the photoresist film pattern.

Continuously, in order to suppress the fluctuation of the threshold voltage ($V_{TH}$) in a region where the channel length is short, an n-type source/drain region 111 and a p-type pocket region 112 are formed by ion implantation on the surface of the p-type well 104 in a self-alignment manner with the gate electrode 110a, and a p-type source/drain region 113 and an n-type pocket region 114 are formed on the surface of the n-type well 103 in a self-alignment manner with the gate electrode 109. The n-type source/drain region 111 is formed by ion implantation of arsenic or phosphorus in $1 \times 10^{13}/cm^{-2}$ or higher at 50 keV or lower energy, the p-type pocket region 112 is formed by ion implantation of boron in $1 \times 10^{12}/cm^{-2}$ or higher at 150 keV or lower energy, the p-type source/drain region 113 is formed by ion implantation of boron in $1 \times 10^{13}/cm^{-2}$ or higher at 100 keV or lower energy and the n-type pocket region 112 is formed by ion implantation of arsenic (or phosphorus) in $1 \times 10^{12}/cm^{-2}$ or higher at 150 keV or lower energy (FIG. 3D).

Following that, as shown in FIG. 2, a silicon oxide film as a second insulating film is formed on the whole surface by, for example, LPCVD. The film thickness of the second insulating film is at thickest about 200 nm. Side wall spacers 115 covering the side faces of the gate electrodes 109, 110a are formed by etching back the second insulating film. Under the conditions of 100 keV or lower energy and $1 \times 10^{14}/cm^{-2}$ or higher dose, arsenic or phosphorus is ion-implanted in the surface of the p-type well 104 in a self-alignment manner with the side wall spacers 115 and the gate electrode 110a. Further, under the conditions of 100 keV or lower energy and $1 \times 10^{14}/cm^2$ or higher dose, boron is ion-implanted in the surface of the n-type well 103 in a self-alignment manner with the side wall spacers 115 and the gate electrode 110a. Furthermore, heating treatment is carried out at 900° C. or higher for 20 minutes or shorter to form an $n^+$-type source/drain region 116 and a $p^+$-type source/drain region 117. As a third high temperature metal film, a titanium film or a cobalt film is formed on the whole surface. After conversion reaction into a silicide film, the unreacted third high melting point metal film is selectively removed to form a high melting point metal silicide layer 118 on the surface of the respective $n^+$-type source/drain region 116 and a $p^+$-type source/drain region 117 in a self-alignment manner and a complementary MISFET of this first embodiment is thus fabricated (FIG. 2).

The effect of this first embodiment will be described in reference with FIG. 4, which is an illustration for describing the effect of the first embodiment and a graph showing the alteration degree ($\Delta V_{TH}$) of the threshold voltage in relation to the nitrogen ion implantation dose in the titanium nitride film.

Figure 4:
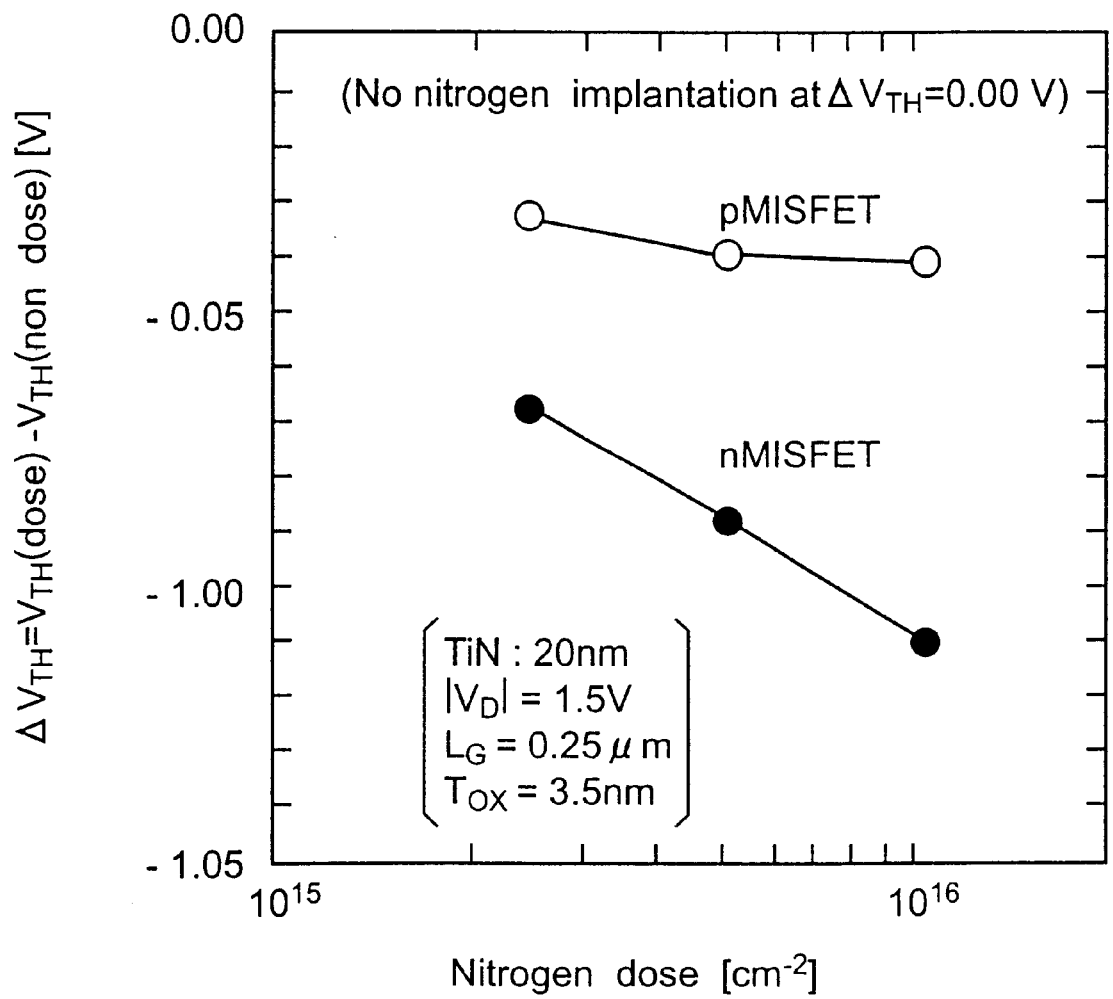
FIG. 4 is an illustration for describing the effect of the first embodiment and a graph showing the alteration value ($\Delta V_{TH}$) of the threshold voltage in relation to the nitrogen ion implantation dose in a titanium nitride film.

In FIG. 4, $\Delta V_{TH} = V_{TH}$ (dose)$-V_{TH}$ (non-dose): wherein the reference character $V_{TH}$ (dose) denotes the threshold voltage in the case of nitrogen ion implantation is carried out and the reference character $V_{TH}$ (non-dose) denotes the threshold voltage before nitrogen ion implantation.

In the case the first high melting point metal was titanium, $\Delta V_{TH}$ was less than 0 for both the n-channel type MISFET and the p-channel type MISFET by nitrogen ion implantation in the titanium nitride film, which was the first conductive film. That is supposedly attributed to the decrease of the work function of titanium nitride by nitrogen implantation. The alteration ratio of $\Delta V_{TH}$ in relation to the dose was higher in the n-channel type MISFET. In the measurement, the film thickness of the titanium nitride film, the first conductive film, was 20 nm, the absolute value of power source voltage ($V_D$) was 1.5 V, the gate length $L_G$ was respectively 0.25 μm, and the film thickness ($T_{OX}$) of the gate oxide film was 3.5 nm.

Such a tendency is characteristic not only for the case of titanium nitride but also for the cases of tungsten nitride and tantalum nitride.

As made clear from the results of FIG. 4, by forming the first conductive film of a titanium nitride film on the whole surface and then converting the film into the second conductive film by ion implantation of nitrogen in the titanium nitride film part covering the surface of the n-type well, the absolute value of the threshold voltage of the p-channel MISFET (of which the first gate electrode is made to be a layered film constituted of the second conductive film and the second high melting point metal film) is increased and dissatisfies a purpose of the present invention. For that, in this first embodiment, nitrogen ion implantation is carried out in the titanium nitride film in the p-type well side to lower the threshold voltage of the n-channel type MISFET. As a result, in the complementary type MISFET comprising the gate electrode with a layered structure of the high melting point metal film on the high melting point metal nitride film, increase of the absolute value of the threshold voltage of the n-channel MISFET can be suppressed.

The second embodiment of the present invention will be described along the fabrication method in the reference with FIG. 5A to FIG. 5D, which are schematic diagrams of a cross-section of the fabrication processes of a semiconductor device according to the second embodiment.

At first, an element separation region 102 with STI structure, an n-type well 103 and a p-type well 104 are formed on the surface of a silicon substrate 101 as same in the first embodiment. A first gate oxide film 105 is formed on the surface of the n-type well 103 and the p-type well 104 by thermal oxidation.

Following that, a titanium nitride film 106 as a first conductive film of a nitride of a first high melting point metal is formed on the whole surface by reactive sputtering at the flow rate ratio ($=N_2/(N_2+Ar)$) of nitrogen gas ($N_2$) about 40% (a relatively low flow rate ratio). The film thickness of the titanium nitride film 106 is at thickest about 100 nm. In this second embodiment, the first high melting point metal is not necessarily limited to be titanium but may be another high melting point metals such as tungsten, tantalum, or the like. In addition to that, the first conductive film may be formed by CVD at a low flow rate ratio of nitrogen gas.

Figure 5A:
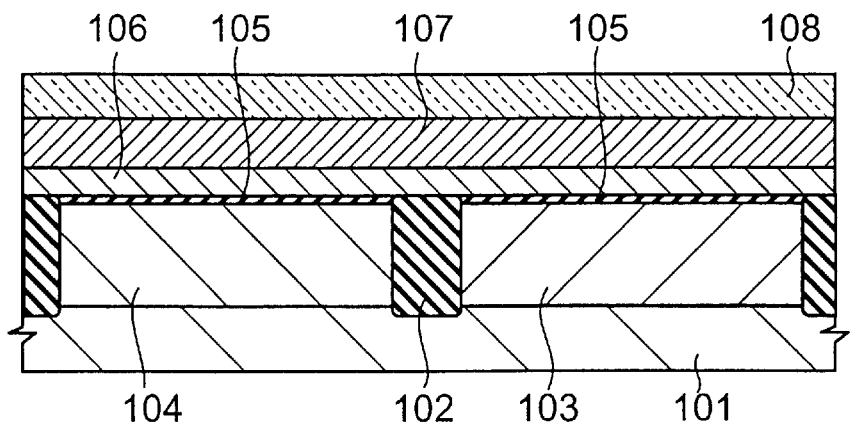
FIG. 5A to FIG. 5D are cross-sectional views showing process steps of a second embodiment.

Continuously, a tungsten film 107, which is a second high melting point metal film, and a hard mask film 108, which is a first insulating film, are formed on the whole surface in the same fabrication conditions as those of the foregoing first embodiment. In this second embodiment, being different from the case of the first embodiment, the existence of the hard mask film 108 is indispensable and the first insulating film is preferably a silicon nitride film (FIG. 5A).

Figure 5B:
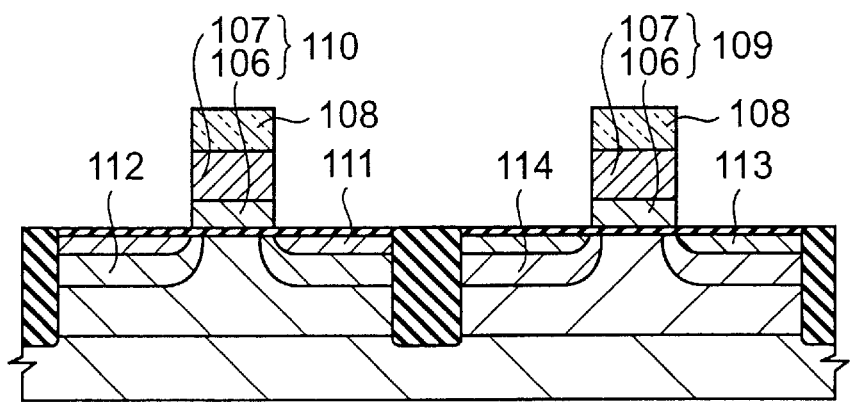

Next, the hard mask film 108, the tungsten film 107, the titanium nitride film 106 are successively patterned by anisotropic etching to form a gate electrode 109 and a temporary gate electrode 110, both of which bear the hard mask film 108, on the respective upper faces on the surface of the p-type well 103 and the n-type well 104 through the first gate oxide film 105. Then, an n-type source/drain region 111 and a p-type pocket region 112 are formed on the surface of the p-type well 104 in a self-alignment manner with the gate electrode 110 and a p-type source/drain region 113 and an n-type pocket region 114 are formed on the surface of the n-type well 103 in a self-alignment manner with the gate electrode 109 in the same fabrication conditions as those of the foregoing first embodiment (FIG. 5B).

Next, a insulating film is formed on the whole surface by LPCVD. The film thickness of the insulating film is at thickest about 200 nm. A silicon oxide film is preferable for the second insulating film. Side wall spacers 115 covering the side faces of the gate electrodes 109, 110 are formed by etching back the insulating film. After that, in the same fabrication conditions as those of the foregoing first embodiment, an $n^+$-type source/drain region 116 is formed on the surface of p-type well 104 in a self-alignment manner with the side wall spacers 115 and the temporary gate electrode structure 110 and a $p^+$-type source/drain region 117 is formed on the surface of the n-type well 103 in a self-alignment manner with the side wall spacers 115 and the first gate electrode 109. Further, a high melting point metal silicide film 118 (a silicide of a third high melting point metal selected from titan or cobalt) is formed respectively on the surface of the $n^+$-type source/drain region 116 and the $p^+$-type source/drain region 117 in a self-alignment manner.

Figure 5C:
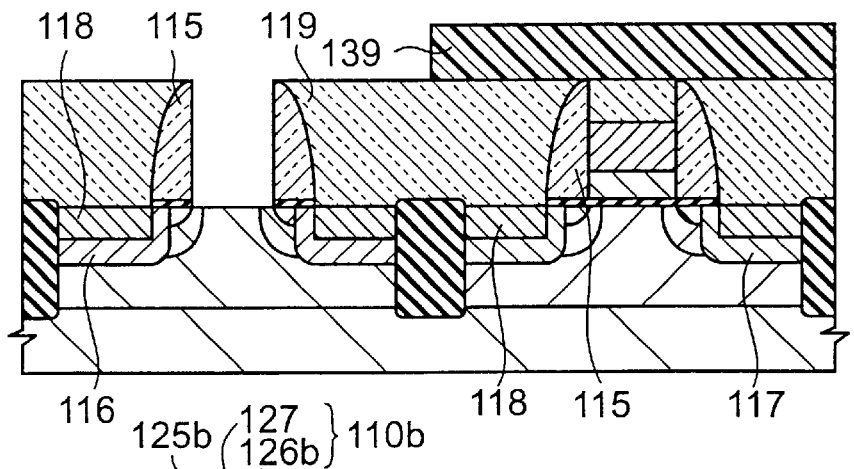

Further, being different from the case of the foregoing first embodiment, an interlayer insulating film 119 of a silicon oxide type insulating film is formed on the whole surface by CVD. The film thickness of the interlayer insulating film 119 is at thickest about 100 nm. The interlayer insulating film 119 is subjected to chemical-mechanical polishing (CMP) until the upper face of the hard mask film 108 formed on the first gate electrode 109 and the upper face the temporary gate electrode are exposed. Continuously, a mask film, such as a photoresist film pattern 139 covering the surface of the p-type well 103 is formed. Using the photoresist film pattern 139 as a mask, the hard mask film 108 formed on the temporary gate electrode structure 110 and the temporary gate electrode structure 110 are successively and selectively removed, Moreover, the first gate oxide film 105 part exposed to the removed parts is removed by wet etching by hydrofluoric type etchant (FIG. 5C).

Furthermore, the above described photoresist film pattern 139 is removed. In addition to that, the photoresist film pattern 139 may be removed prior to the removal of the gate oxide film 105 exposed to the removed part of the temporary gate electrode.

In succession, a second gate oxide film 125b is formed on the whole surface by preferably LPCVD. The film thickness of the gate oxide film 125b is at thickest about 10 nm. Continuously, for example, a titanium nitride film 126b as a second conductive film of a nitride of the first high melting point metal is formed on the whole surface by reactive sputtering at about 80% of the nitrogen gas ($N_2$) flow rate ratio (a relatively high flow rate ratio). The nitrogen content in the titanium nitride film 126b is controlled to be higher than that in the titanium nitride film 106. The thickness of the titanium nitride film 126b is at thickest about 200 nm. The formation of the titanium nitride film 126b may be carried out by CVD (as of titanium nitride film 126). As a metal film, for example, a tungsten film 127 is formed on the whole surface by CVD or sputtering. The thickness of the tungsten film 127 is at thickest about 200 nm. In this second embodiment, the metal constituting the metal film is not limited to a high melting point metal such as tungsten but may be aluminum-based alloys, copper, and the likes.

Figure 5D:
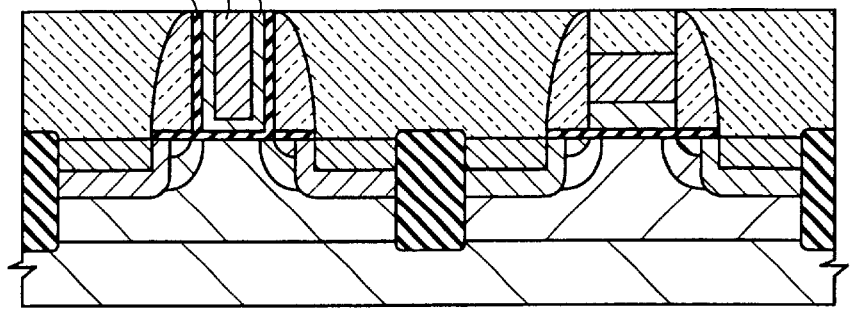

Then, the tungsten film 127, the titanium nitride film 126b and a gate oxide film 125b are subjected to CMP until the upper face of the interlayer insulating film 119 and the upper face of the hard mask film 108 formed on the first gate electrode 109 are exposed. (Optionally, the layered film of the titanium nitride film 126b and the tungsten film 127 may be subjected to CMP until the gate oxide film 125b part directly covering the upper face of the interlayer insulating film 119 and the upper face of the hard mask film 108 formed on the first gate electrode 109 is exposed. Nevertheless, the foregoing method is more preferable in terms of CMP controllability). Consequently, a second gate electrode 110b is so formed as to have a layered structure of tungsten film 127 and the titanium nitride film 126b on the tungsten film 127. The side faces of the second gate electrode 110b are covered with side wall spacers 115 through the second gate oxide film 125b and the surface of the second gate oxide film 125b is directly covered with the titanium nitride film 126b, the second conductive film (FIG. 5D).

The effect of this second embodiment will be described in reference with FIG. 6, which is an illustration for describing the effect of the second embodiment and a graph showing the alteration degree ($\Delta V_{TH}$) of the threshold voltage in relation to the nitrogen gas flow rate ratio at the time of the titanium nitride film formation.

Figure 6:
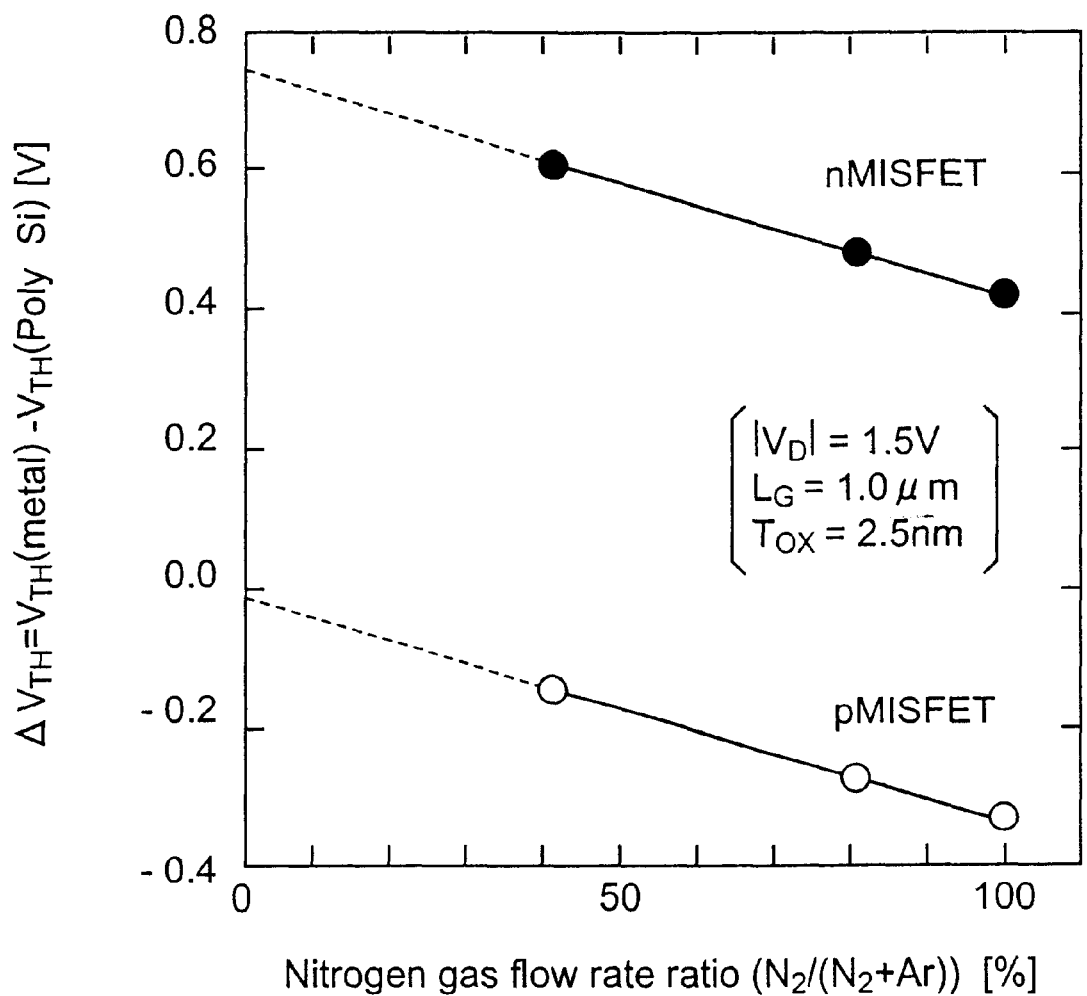
FIG. 6 is an illustration for describing the effect of the second embodiment and a graph showing the alteration value ($\Delta V_{TH}$) of the threshold voltage in relation to the nitrogen gas flow rate ratio at the time of formation of a titanium nitride film.

In FIG. 6, $\Delta V_{TH} = V_{TH}$ (metal)$-V_{TH}$ (poly-Si): wherein the reference character $V_{TH}$ (metal) denotes the threshold voltage of a (n-channel type or p-channel type) MISFET having a gate electrode a conductive film of a nitride of a first high melting point metal and either a second high melting point metal film of a metal film on the conductive film; and the reference character $V_{TH}$ (poly-Si) denotes the threshold voltage of a (n-channel type or p-channel type) MISFET having a gate electrode of a ($n^+$-type or $p^+$-type) polycrystalline silicon film.

In the case the first high melting point metal was titanium, $\Delta V_{TH}$ was shifted in the negative direction for both the n-channel type MISFET and the p-channel type MISFET by heightening the flow rate ratio of nitrogen gas at the time of forming the titanium nitride film, which was the first conductive film. That is, as same in the case of the foregoing first embodiment, supposedly attributed to the decrease of the work function of titanium nitride owing to the increase of nitrogen content in the titanium nitride film. The measurement was carried out using a MISFET with sufficiently long gate length as to eliminate short channel effects. The absolute value of power source voltage ($V_D$) was 1.5 V and the gate length $L_G$ was respectively 1.0 µm, and the film thickness ($T_{OX}$) of the gate oxide film was 2.5 nm. Such a tendency is characteristic not only for the case of titanium nitride but also for the cases of tungsten nitride and tantalum nitride.

Based on the results of FIG. 6, by setting the nitrogen content to be low in the titanium nitride film of the first gate electrode of the p-channel type MISFET and to be high in the titanium nitride film of the second gate electrode of the n-channel type MISFET, a purpose of the present invention can be satisfied. As is made clear by comparison of FIG. 4 and FIG. 6, it is easy to lower the threshold voltage of the n-channel MISFET in this second embodiment as compared with that in the foregoing first embodiment.

In the case the flow rate ratio of nitrogen gas is lower than 30%, the titanium nitride film is not provided with the function as a barrier. For that, the formation of the titanium nitride film constituting the first gate electrode is preferably carried out in condition of at least about 30% nitrogen gas flow rate ratio.

Figure 7A:
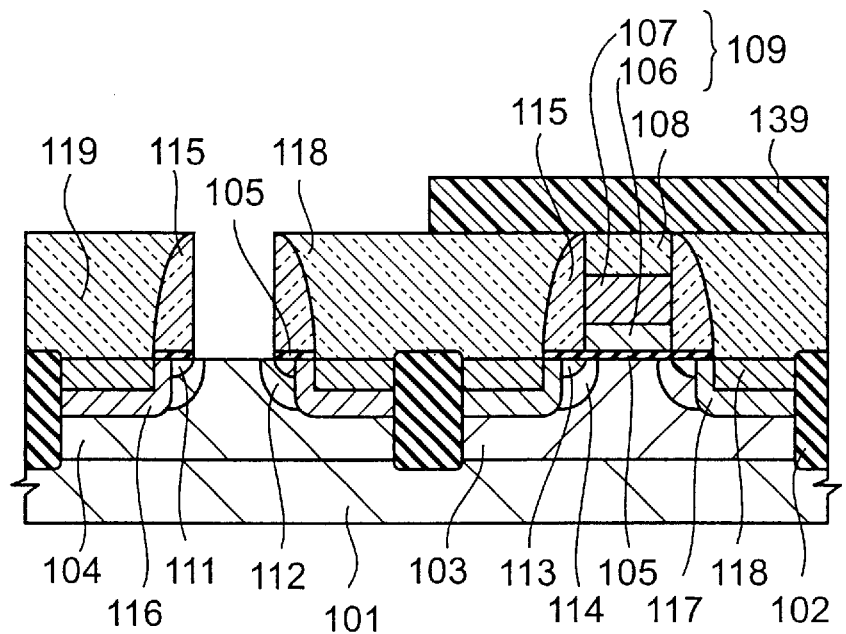
FIG. 7 A and FIG. 7B are cross-sectional views showing process steps of a third embodiment.
Figure 7B:
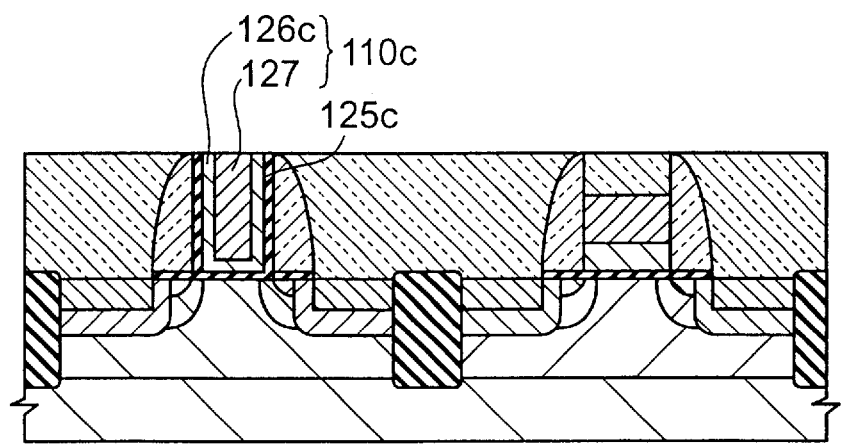

FIG. 7A and FIG. 7B are cross-section schematic diagrams of the main fabrication processes of a semiconductor device according to the third embodiment of the present invention, which is an application example of the foregoing second embodiment.

At first, in the same manner for the foregoing first and second embodiments, an element separation region 102 with STI structure, an n-type well 103 and a p-type well 104 are formed on the surface of a silicon substrate 101 and a first gate oxide film 105 is formed respectively on the surface of the n-type well 103 and the p-type well 104 by thermal oxidation. A titanium nitride film 106 is formed on the whole surface by reactive sputtering at the flow rate ratio of nitrogen gas at least about 30%, preferably 40%.

Continuously, in the same manner as the second embodiment, a tungsten film 107 and a hard mask film 108 are formed on the whole surface and then the hard mask film 108, the tungsten film 107 and the titanium nitride film 106 are successively patterned by anisotropic etching to form a first gate electrode 109 and a temporary gate electrode structure (not shown) both of which bear the hard mask film 108 on the respective upper faces. An n-type source/drain region 111 and a p-type pocket region 112 are formed on the surface of the p-type well 104 in a self-alignment manner with the gate electrode 110a and a p-type source/drain region 113 and an n-type pocket region 114 are formed on the surface of the n-type well 103 in a self-alignment manner with the gate electrode 109. A second insulating film is formed on the whole surface and the second insulating film is etched back to form side wall spacers 115 covering the side faces of the gate electrode 109 and the temporary gate electrode.

Further, an $n^+$-type source/drain region 116 is formed on the surface of p-type well 104 in a self-alignment manner with the side wall spacers 115 and the temporary gate electrode and a $p^+$-type source/drain region 117 is formed on the surface of the n-type well 103 in a self-alignment manner with the side wall spacers 115 and the first gate electrode 109. Further, a high melting point metal silicide film 118 (of a silicide of a third high melting point metal, titanium or cobalt) is formed respectively on the surface of the $n^+$-type source/drain region 116 and the $p^+$-type source/drain region 117 in a self-alignment manner.

Further, as same as the foregoing second embodiment, an interlayer insulating film 119 of a silicon oxide type insulating film is formed on the whole surface by CVD. The interlayer insulating film 119 is subjected to chemical-mechanical polishing (CMP) until the upper face of the hard mask film 108 formed on the first gate electrode 109 and the upper face the temporary gate electrode are exposed. Continuously, a mask film, such as a photoresist film pattern 139 is formed as to cover the surface of the p-type well 103. Using the photoresist film pattern 139 as a mask, the hard mask film formed on the temporary gate electrode and the temporary gate electrode are successively and selectively removed, Moreover, the first gate oxide film 105 part exposed to the removed parts is removed by wet etching by hydrofluoric type etchant (FIG. 7A).

Furthermore, the above described photoresist film pattern 139 is removed. In addition to that, the photoresist film pattern 139 may be removed prior to the removal of the gate oxide film 105 exposed to the removed part of the temporary gate electrode.

In succession, a second gate oxide film 125c is formed on the whole surface by preferably LPCVD. The film thickness of the gate oxide film 125c is at thickest about 10 nm. Continuously, for example, a titanium nitride film 126c as a second conductive film of anitride of the first high melting point metal is formed on the whole surface by reactive sputtering at about 100% of the nitrogen gas ($N_2$) flow rate ratio (a relatively high flow rate ratio) (reference to FIG. 6). The crystal orientation of the titanium nitride film 126b formed at the nitrogen gas flow rate ratio of about 40% is approximately {1 1 1}. On the other hand, the crystal orientation of this titanium nitride film 126c is approximately {2 0 0}. The formation of the titanium nitride film 126c may be carried out by CVD. As a metal film, for example, a tungsten film 127 is formed on the whole surface by CVD or sputtering. The thickness of the tungsten film 127 is at thickest about 200 nm. Also in this third embodiment, the metal constituting the metal film is not limited to a high melting point metal such as tungsten but may be aluminum-based alloys, copper, and the likes.

Then, the tungsten film 127, the titanium nitride film 126c and a gate oxide film 125c are subjected to CMP until the upper face of the interlayer insulating film 119 and the upper face of the hard mask film 108 formed on the first gate electrode 109 are exposed. Consequently, a second gate electrode 110c is so formed as to have a layered structure of tungsten film 127 and the titanium nitride film 126c on the tungsten film 127. The side faces of the second gate electrode 110b are also covered with side wall spacers 115 through the second gate oxide film 125c and the surface of the second gate oxide film 125c is directly covered with the titanium nitride film 126c, which is the second conductive film (FIG. 7B).

This third embodiment is provided with the same effects the foregoing second embodiment is provided with.

This invention is not limited to the foregoing first embodiment. The gate insulating film constituting the n-channel type MISFET of the second embodiment of the present invention is an insulating film containing nitrogen. In the second embodiment, the nitrogen content of the second conductive film of a nitride of a first high melting point metal constituting the second gate electrode is increased by solid-phase diffusion of nitrogen from the gate insulating film constituting the n-channel type MISFET.

Figure 8A:
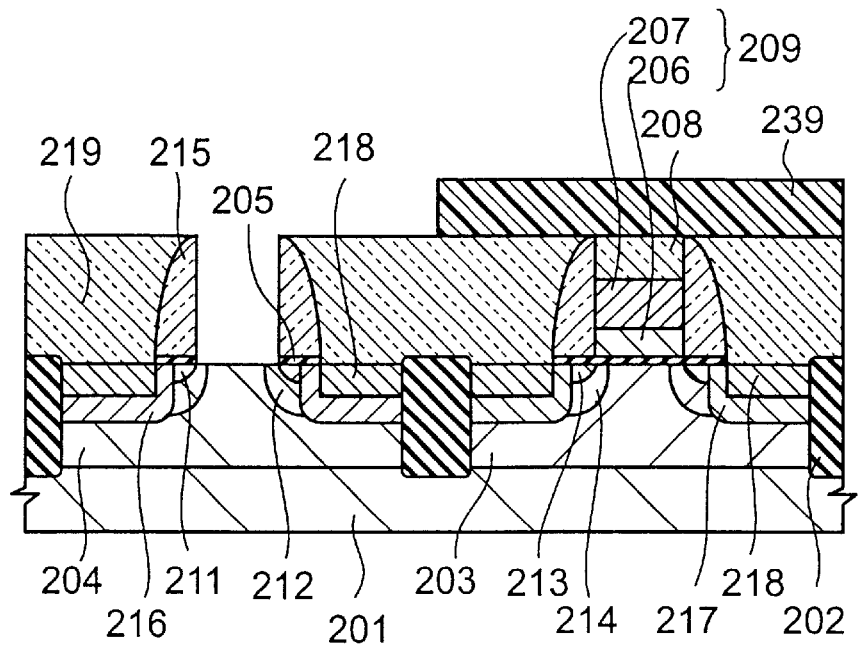
FIG. 8 A and FIG. 8B are cross-sectional views showing process steps of a fourth embodiment.
Figure 8B:
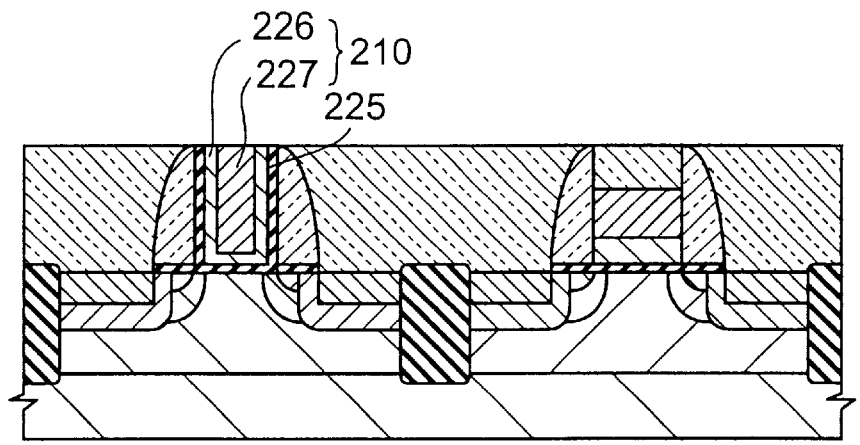

FIG. 8A and FIG. 8B are cross-section schematic diagrams of the main fabrication processes of a semiconductor device according to the fourth embodiment.

As the previous embodiments, at first, an element separation region 202 with, for example, a STI structure, an n-type well 203 and a p-type well 204 are formed on the surface of a silicon substrate 201 and a gate oxide film 205 is formed respectively on the surface of the n-type well 203 and the p-type well 204 by thermal oxidation. The film thickness of the gate oxide film 205 is at thickest about 10 nm. For example, a titanium nitride film 206 (which is a first conductive film of a nitride of a first high melting point metal) is formed on the whole surface by reactive sputtering or CVD. Also in this example, the first high melting point metal is not limited to titanium but may be tungsten or tantalum.

Continuously, in the same manner as the second embodiment, a tungsten film 207, which is a second high melting point metal film, and a hard mask film 208 are formed on the whole surface and then the hard mask film 208, the tungsten film 207 and the titanium nitride film 206 are successively patterned by anisotropic etching to form a first gate electrode 209 and a temporary gate electrode (not shown) respectively bearing the hard mask film 208 on the upper faces. Also in this example, the second high melting point metal film is not limited to the tungsten film but may be a titanium film or a tantalum film. An n-type source/drain region 211 and a p-type pocket region 212 are formed on the surface of the p-type well 204 in a self-alignment manner with the temporary gate electrode and a p-type source/drain region 213 and an n-type pocket region 214 are formed on the surface of the n-type well 203 in a self-alignment manner with the gate electrode 209. A second insulating film is formed on the whole surface and the second insulating film is etched back to form side wall spacers 215 covering the side faces of the gate electrode 209 and the temporary gate electrode structure.

Further, an n$^+$-type source/drain region 216 is formed on the surface of a p-type well 204 in a self-alignment manner with the side wall spacers 215 and the temporary gate electrode and a p$^+$-type source/drain region 217 is formed on the surface of the n-type well 203 in a self-alignment manner with the side wall spacers 215 and the first gate electrode 209. Further, a high melting point metal silicide film 218 (of a silicide of a third high melting point metal, titanium or cobalt) is formed respectively on the surface of the n$^+$-type source/drain region 216 and the p$^+$-type source/drain region 217 in a self-alignment manner.

Further, as same as the foregoing second embodiment, an interlayer insulating film 219 of a silicon oxide type insulating film is formed on the whole surface by CVD. The interlayer insulating film 219 is subjected to CMP until the upper face of the first gate electrode 209 and the upper face of the hard mask film 208 formed on the foregoing temporary gate electrode structure are exposed. Continuously, a photoresist film pattern 239 is formed as to cover the surface of the p-type well 203. Using the photoresist film pattern 239 as a mask, the hard mask film formed on the temporary gate electrode structure and the temporary gate electrode structure are successively and selectively removed. Moreover, the gate oxide film 205 part exposed to the removed parts is removed by wet etching by hydrofluoric type etchant (FIG. 8A).

Furthermore, the above described photoresist film pattern 239 is removed. At that time, the photoresist film pattern 239 may be removed prior to the removal of the gate oxide film 205 exposed to the removed part of the temporary gate electrode.

In succession, a gate insulating film 225 of, for example, a silicon nitride oxide or a silicon nitride is formed on the whole surface. The film thickness of the gate oxide film 225 is at thickest about 10 nm calculated by conversion into a silicon oxide film. In the case the gate insulating film 225 is of a silicon nitride oxide film. The film 225 is formed by PECVD from a gas mixture of $SH_4$, $N_2O$ and $NH_3$ in a pressure of about $7 \times 10^3$ Pa. At that time, the nitrogen content in the gate insulating film 225 is controlled by the flow rate ratio of ammonia gas. In the case the gate insulating film 225 is of a silicon nitride film, the film is formed by LPCVD or PECVD. Also in that case, the nitrogen content in the gate insulating film 225 is controlled by the flow rate ratio of ammonia gas. Continuously, a titanium nitride film 226 (which is a second conductive film of a nitride of the first high melting point metal) is formed on the whole surface in the same conditions as those for the foregoing titanium nitride film 206 formation.

After that, thermal treatment at 900° C. for about 10 seconds is carried out to carry out solid-phase thermal diffusion of nitrogen to the titanium nitride film 226 from the gate insulating film 225. Consequently, the nitrogen content in the titanium nitride film 226 is heightened to be higher than that in the titanium nitride film 206.

Next, for example, a tungsten film 227 as a metal film is formed on the whole surface by CVD or sputtering. The thickness of the tungsten film 227 is at thickest about 200 nm. Also in this example, the metal constituting the metal film is not limited to a high melting point metal such as tungsten but may be aluminum-based alloys, copper, and the likes.

Then, the tungsten film 227, the titanium nitride film 226 and the gate oxide film 225 are subjected to CMP until the upper face of the interlayer insulating film 219 and the upper face of the hard mask film 208 formed on the first gate electrode 209 are exposed. Consequently, a second gate electrode 210 is so formed as to have a layered structure of the tungsten film 227 and the titanium nitride film 226 on the tungsten film 227. The side faces of the second gate electrode 210 are covered with side wall spacers 215 through the second gate oxide film 225 and the surface of the second gate oxide film 225 is directly covered with the titanium nitride film 226, which is the second conductive film (FIG. 8B).

This embodiment is provided with the same effects of the foregoing embodiment.

Figure 9A:
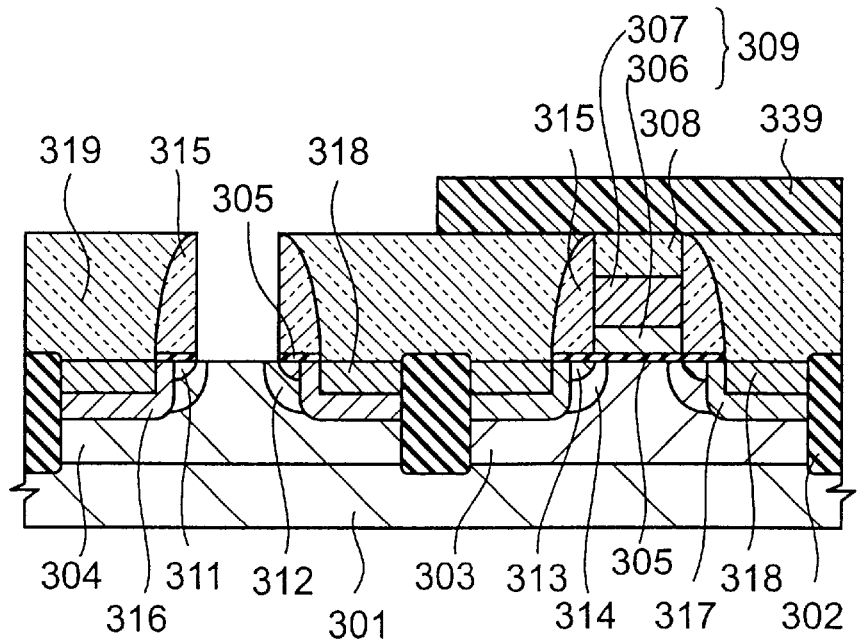
FIG. 9 A and FIG. 9B are cross-sectional views showing process steps of a fifth embodiment.
Figure 9B:
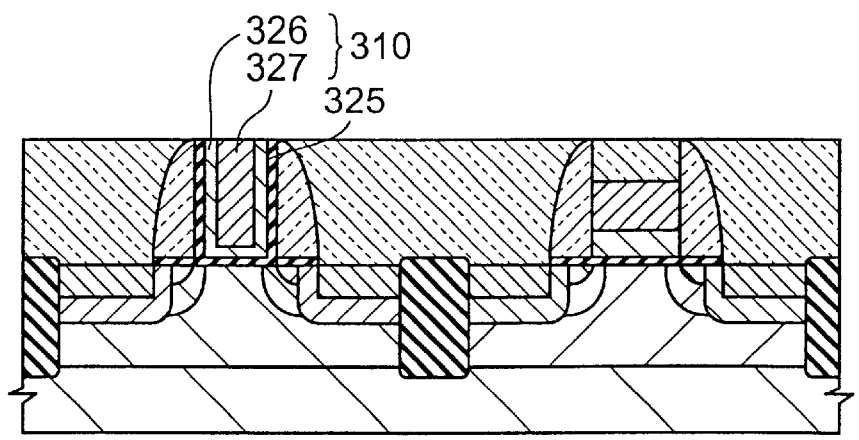

FIG. 9A and FIG. 9B are cross-section schematic diagrams of the main fabrication processes of a semiconductor device according to the fifth embodiment.

A first conductive film constituting a first gate electrode of a p-channel MISFET is of a nitride of a first high melting point metal and on the other hand, the second conductive film constituting a second gate electrode of an n-channel MISFET is of a nitride of another high melting point metal. In this case, the second high melting point metal is so selected as to control the work function of the second conductive film to be lower than that of the first conductive film.

A cross-section schematic diagram of a semiconductor device in the main fabrication process, one example of this third embodiment will be configured as following.

At first, in the same manner for the foregoing the first embodiment, an element separation region 302 with, for example, a STI structure, an n-type well 303 and a p-type well 304 are formed on the surface of a silicon substrate 301 and a gate oxide film 305 is formed respectively on the surface of the n-type well 303 and the p-type well 304 by thermal oxidation. The film thickness of the gate oxide film 305 is at thickest about 10 nm. For example, a titanium nitride film 306 (which is a first conductive film of a nitride of a first high melting point metal) is formed on the whole surface by reactive sputtering or CVD.

Continuously, in the same manner as the second embodiment, a tungsten film 307, which is a second high melting point metal film, and a hard mask film 308 are formed on the whole surface and then the hard mask film 308, the tungsten film 307 and the titanium nitride film 306 are successively patterned by anisotropic etching to form a first gate electrode 309 and a temporary gate electrode structure (not shown) respectively bearing the hard mask film 308 on the upper faces. Also in this example, the second high melting point metal film is not limited to the tungsten film but may be a titanium film or a tantalum film. An n-type source/drain region 311 and a p-type pocket region 312 are formed on the surface of the p-type well 304 in a self-alignment manner with the temporary gate electrode and a p-type source/drain region 313 and an n-type pocket region 314 are formed on the surface of the n-type well 303 in a self-alignment manner with the gate electrode 309. A second insulating film is formed on the whole surface and the second insulating film is etched back to form side wall spacers 315 covering the side faces of the gate electrode 309 and the temporary gate electrode.

Further, an n$^+$-type source/drain region 316 is formed on the surface of a p-type well 304 in a self-alignment manner with the side wall spacers 315 and the temporary gate electrode structure and a p$^+$-type source/drain region 317 is formed on the surface of the n-type well 303 in a self-alignment manner with the side wall spacers 315 and the first gate electrode 309. A high melting point metal silicide film 318 (of a silicide of a third high melting point metal, titanium or cobalt) is formed respectively on the surface of the n$^+$-type source/drain region 316 and the p$^+$-type source/drain region 317 in a self-alignment manner.

Further, as same as the foregoing the second embodiment, an interlayer insulating film 319 of a silicon oxide type insulating film is formed on the whole surface by CVD. The interlayer insulating film 319 is subjected to CMP until the upper face of the first gate electrode 309 and the upper face of the hard mask film 308 formed on the foregoing temporary gate electrode structure are exposed. Continuously, a photoresist film pattern 339 is formed as to cover the surface of the p-type well 303. Using the photoresist film pattern 339 as a mask, the hard mask film formed on the temporary gate electrode and the temporary gate electrode are successively and selectively removed, Moreover, the gate oxide film 305 part exposed to the removed parts is removed by wet etching by hydrofluoric type etchant (FIG. 9A).

Furthermore, the above described photoresist film pattern 339 is removed. At that time, the photoresist film pattern 339 may be removed prior to the removal of the gate oxide film 305 exposed to the removed part of the temporary gate electrode structure.

In sucession, a gate insulating film 325 of, for example, a tantalum nitride oxide is formed by CVD on the whole surface. The film thickness of the gate oxide film 325 is at the thickest about 10 nm calculated by conversion into a silicon oxide film. In this example, the gate insulating film 325 is not limited to the tantalum nitride oxide film but may be, for example, a silicon oxide film. Continuously, a tantalum nitride film 326 is formed as a second conductive film of a nitride of a fourth high melting point metal by CVD or sputtering and then a tantalum film 327 is formed as a metal film on the whole surface by CVD or sputtering. The thickness of the tantalum film 327 is at the thickest about 200 nm. In this example, the metal constituting the metal film is not limited to tantalum but may be other high melting point metals, aluminum-based alloys, copper and the like.

Then, the tantalum film 327, the tantalum nitride film 326 and the gate insulating film 325 are subjected to CMP until the upper face of the interlayer insulating film 319 and the upper face of the hard mask film 308 formed on the first gate electrode 309 are exposed. Consequently, a second gate electrode 310 is so formed as to have a layered structure of the tantalum film 327 and the tantalum nitride film 326 on the tantalum film 327. The side faces of the second gate electrode 310 are covered with side wall spacers 315 through the gate insulating film 325 and the surface of the gate insulating film 325 is directly covered with the tantalum nitride film 326, which is the second conductive film (FIG. 9B).

The fifth embodiment is provided with the same effects the foregoing embodiments are provided with.

As described above, the prevent invention can control the work function of a conductive film constituting a gate electrode of an n-channel type MISFET to be smaller than the work function of a conductive film constituting a gate electrode of a p-channel type MISFET, regarding a MISFET comprising a gate electrode with a layered structure of a conductive film (of a nitride of a high melting point metal) and a metal film (or a high melting point metal). As a result, increase of the threshold voltage of at least the n-channel type MISFET can easily be suppressed.

What is claimed is:

1. A semiconductor device comprising:
   a silicon substrate;
   an n-type well and a p-type well formed on the surface of said silicon substrate and separated from each other by an element separation region;
   a p-channel type insulated gate field effect transistor formed on said n-type well and having a first gate electrode; and an n-channel type insulated gate field effect transistor formed on said p-type well and having a second gate electrode;

said first gate electrode formed on the surface of said n-type well by interposing a first gate oxide film ,and including a first conductive film of a nitride of a first high melting point metal directly contacted to the surface of said first gate oxide film and a second high melting point metal film formed on the surface of said first conductive film, and said second gate electrode formed on the surface of said p-well by interposing a second gate oxide film ,and including a second conductive film of a nitride of said first high melting point metal with higher nitrogen content than that of said first conductive film and directly contacted to the surface of said second gate oxide film and a metal film formed on the surface of said second conductive film.

2. A semiconductor device as set forth in claim 1, wherein side faces of said first and second gate electrodes are respectively directly coated with side wall spacers, said first and second gate oxide films are made of thermal oxidation films, said metal film constituting said second gate electrode is made of said second high melting point metal film and said first high melting point metal is selected from titanium, tungsten, and tantalum.

3. A semiconductor device as set forth in claim 1, wherein each side face of said first gate electrode is directly coated with a side wall spacer, each side face of said second gate electrode is coated with a side wall spacer through said second gate oxide film and said first high melting point metal is selected from titanium, tungsten, and tantalum.

4. A semiconductor device as set forth in claim 3, wherein crystal orientation of said second conductive film differs from that of said first conductive film.

5. A semiconductor device comprising:

a silicon substrate;

an n-type well and a p-type well formed on the surface of said silicon substrate and separated from each other by an element separation region;

a p-channel type insulated gate field effect transistor formed on said n-type well and having a first gate electrode;

an n-channel type insulated gate field effect transistor formed on said p-type well and having a second gate electrode; and side wall spacers respectively made of insulating films coating the side faces of said first and second gate electrodes, wherein said first gate electrode formed on the surface of said n-type well by interposing a first gate oxide film formed by thermal oxidation is constituted of a first conductive film of a nitride of a first high melting point metal directly coating the surface of said gate oxide film and a second high melting point metal film formed on the surface of said first conductive film, said second gate electrode formed on the surface of said p-well by interposing a gate insulating film containing nitrogen is constituted of a second conductive film of a nitride of said first high melting point metal with a higher nitrogen content than that of said first conductive film and directly coating the surface of said gate insulating film and a metal film formed on the surface of said second conductive film, side faces of said first gate electrode are directly coated with said side wall spacers and side faces of said second gate electrode are coated with said side wall spacers through said gate insulating film.

6. A semiconductor device as set forth in claim 5, wherein said gate insulating film is a silicon nitride film or a silicon nitride oxide film, and said first high melting point metal is selected from titanium, tungsten, and tantalum.

7. A semiconductor device comprising a complementary insulated gate field effect transistor composed of a p-channel type insulated gate field effect transistor having a gate electrode and an n-channel type insulated gate field effect transistor having a gate electrode;

said gate electrode of said p-channel type insulated gate field effect transistor including a conductive layer of a nitride of a high melting point metal;

said gate electrode of said n-channel type insulated gate field effect transistor including a conductive layer of a nitride of the same high melting point metal material as said high melting point metal in said p-channel type insulated gate field effect transistor; wherein said conductive layer in said gate electrode of one of said transistors has a higher nitrogen content than that of said conductive layer in said gate electrode of the other of said transistors.

8. A semiconductor device as set force in claim 7, wherein said one of said transistors is said n-channel type insulated gate field effect transistor, and said other of said transistors is said p-channel type insulated gate field effect transistor.

9. A semiconductor device as set force in claim 7, wherein said gate electrode has a laminated layers structure including said conductive layer of said nitride of said high melting point metal.

10. A semiconductor device as set force in claim 8, wherein said gate electrode has a laminated layers structure including said conductive layer of said nitride of said high melting point metal.

11. A semiconductor device as set force in claim 9, wherein said conductive layer is a lowest layer in said laminated layers structure.

12. A semiconductor device as set force in claim 10, wherein said conductive layer is a lowest layer in said laminated layers structure.

13. A semi conductor device as set force in claim 7, wherein said high melting point metal includes an element selected from a group consisting of titanium, tungsten and tantalum.

14. A semiconductor device as set force in claim 8, wherein said high melting point metal includes an element selected from a group consisting of titanium, tungsten and tantalum.

15. A semi conductor device as set force in claim 9 wherein said high melting point metal includes an element selected from a group consisting of titanium, tungsten and tantalum.

16. A semiconductor device as set force in claim 10, wherein said high melting point metal includes an element selected from a group consisting of titanium, tungsten and tantalum.

17. A semiconductor device as set force in claim 11, wherein said high melting point metal includes an element selected from a group consisting of titanium, tungsten and tantalum.

18. A semiconductor device as set force in claim 12 wherein said high melting point metal includes an element selected from a group consisting of titanium, tungsten and tantalum.

19. A semiconductor device as set force in claim 13, wherein another high melting point metal layer is formed on said conductive layer in said laminated layers structure.

20. A semiconductor device as set force in claim 14, wherein another high melting point metal layer is formed on said conductive layer in said laminated layers structure.

21. A semiconductor device as set force in claim 15, wherein another high melting point metal layer is formed on said conductive layer in said laminated layers structure.

22. A semiconductor device as set force in claim 16, wherein another high melting point metal layer is formed on said conductive layer in said laminated layers structure.

23. A semiconductor device as set force in claim 17, wherein another high melting point metal layer is formed on said conductive layer in said laminated layers structure.

24. A semiconductor device as set force in claim 18, wherein another high melting point metal layer is formed on said conductive layer in said laminated layer structure.

* * * * *